(12) United States Patent  
Cook

(10) Patent No.: US 10,295,573 B2  
(45) Date of Patent: *May 21, 2019

(54) COMPENSATED ROGOWSKI COIL

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 345 days.

This patent is subject to a terminal disclaimer.

(21) Appl. No.: 15/178,953

(22) Filed: Jun. 10, 2016

(65) Prior Publication Data
US 2017/0059622 A1    Mar. 2, 2017

Related U.S. Application Data

(60) Provisional application No. 62/213,433, filed on Sep. 2, 2015.

(51) Int. Cl.
*G01R 15/18* (2006.01)

(52) U.S. Cl.
CPC .................................. *G01R 15/181* (2013.01)

(58) Field of Classification Search
None
See application file for complete search history.

(56) References Cited

U.S. PATENT DOCUMENTS

| | | | |
|---|---|---|---|
| 4,709,339 A | 11/1987 | Fernandes | |
| 5,414,400 A | 5/1995 | Gris et al. | |
| 5,559,470 A * | 9/1996 | Laber | H03H 11/0466 |
| | | | 330/252 |
| 5,582,395 A | 12/1996 | Cheng | |
| 6,313,623 B1 * | 11/2001 | Kojovic | G01R 15/181 |
| | | | 324/127 |
| 6,879,479 B2 * | 4/2005 | Colombo | G01R 15/142 |
| | | | 361/93.6 |
| 7,227,441 B2 | 6/2007 | Skendzic et al. | |
| 7,227,442 B2 | 6/2007 | Skendzic | |
| 7,538,541 B2 | 5/2009 | Kojovic | |
| 7,564,233 B2 | 7/2009 | Kojovic | |
| 7,902,812 B2 | 3/2011 | Kojovic | |
| 7,986,968 B2 | 7/2011 | Dobrowski et al. | |
| 8,330,449 B2 | 12/2012 | Greenberg | |
| 8,872,611 B2 | 10/2014 | Rouaud et al. | |
| 9,329,659 B2 | 5/2016 | Cook | |
| 9,442,139 B2 | 9/2016 | Hobelsberger et al. | |
| 9,448,258 B2 | 9/2016 | Garabieta et al. | |
| 2002/0047942 A1 * | 4/2002 | Vorenkamp | H04N 5/455 |
| | | | 348/731 |
| 2004/0183522 A1 | 9/2004 | Gunn | |
| 2008/0191704 A1 | 8/2008 | Gholami et al. | |
| 2011/0012587 A1 * | 1/2011 | Greenberg | G01R 1/22 |
| | | | 324/114 |
| 2011/0012589 A1 * | 1/2011 | Greenberg | G01R 15/12 |
| | | | 324/127 |
| 2011/0043190 A1 | 2/2011 | Farr | |

(Continued)

FOREIGN PATENT DOCUMENTS

WO    2006108021 A2    10/2006
WO    2012022779 A1    2/2012

*Primary Examiner* — Paresh H Patel

(74) *Attorney, Agent, or Firm* — Chernoff, Vilhauer, McClung & Stenzel, LLP

(57) ABSTRACT

A coil that includes compensation.

20 Claims, 22 Drawing Sheets

(56) References Cited

U.S. PATENT DOCUMENTS

| | | |
|---|---|---|
| 2016/0055963 A1 | 2/2016 | Lockstedt et al. |
| 2016/0091535 A1 | 3/2016 | Bannister et al. |
| 2017/0059620 A1 | 3/2017 | Cook |
| 2017/0059621 A1 | 3/2017 | Cook |
| 2017/0059623 A1 | 3/2017 | Cook |
| 2017/0059624 A1 | 3/2017 | Cook |
| 2017/0059625 A1 | 3/2017 | Cook |

* cited by examiner

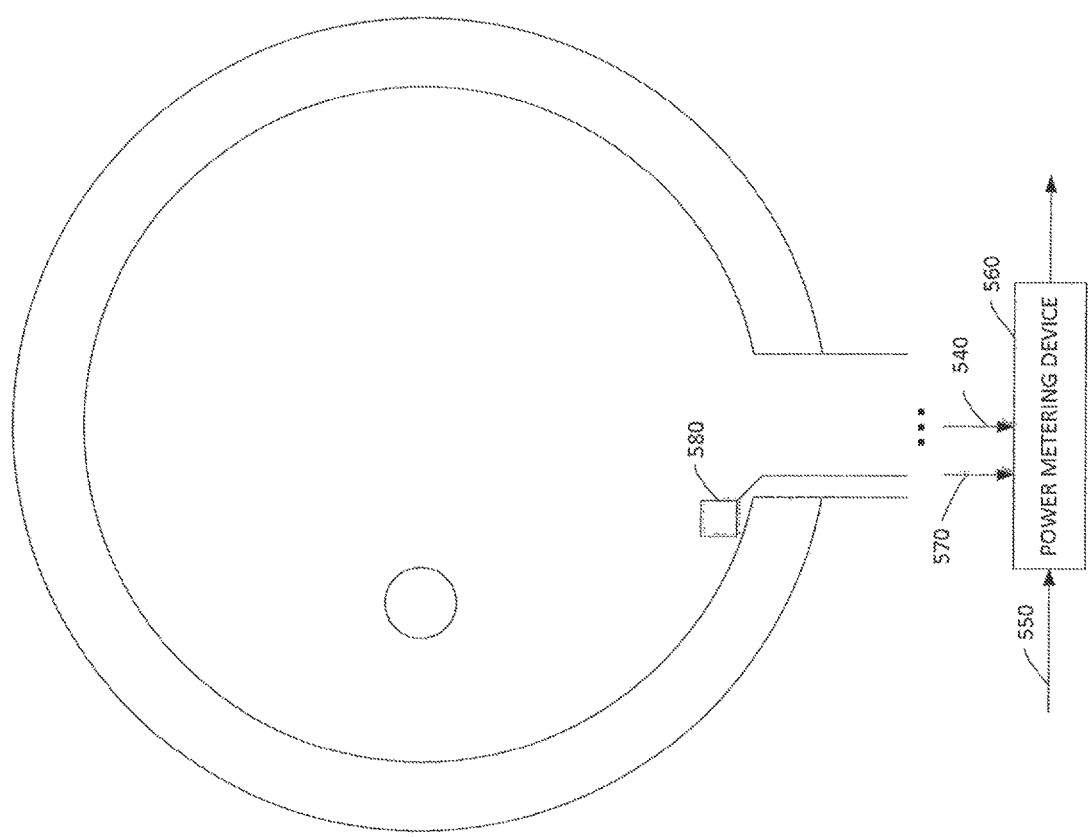

COMPENSATED ROGOWSKI COIL

CROSS-REFERENCE TO RELATED APPLICATIONS

This application claims the benefit of U.S. Provisional App. No. 62/213,433, filed Sep. 2, 2015.

TECHNICAL FIELD

The present disclosure relates generally to a Rogowski coil.

BACKGROUND OF THE INVENTION

A number of different types of measurement devices may be utilized to detect or monitor current signals. For example, measurement devices are typically integrated into utility meters in order to monitor the current on one or more phases of an electrical power signal. In conventional devices, current transformers, shunts, and Hall Effect transducers are traditionally used to monitor current signals. More recently, Rogowski coils have been utilized to monitor current signals. With a Rogowski coil, current flowing through a conductor generates a magnetic field that induces a voltage in the coil. Using the voltage output signal of the coil, current conditions within the conductor can be calculated.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWINGS

FIG. 21 illustrates a Rogowski coil together with a temperature compensated power metering device.

DETAILED DESCRIPTION OF PREFERRED EMBODIMENT

Figure 1:
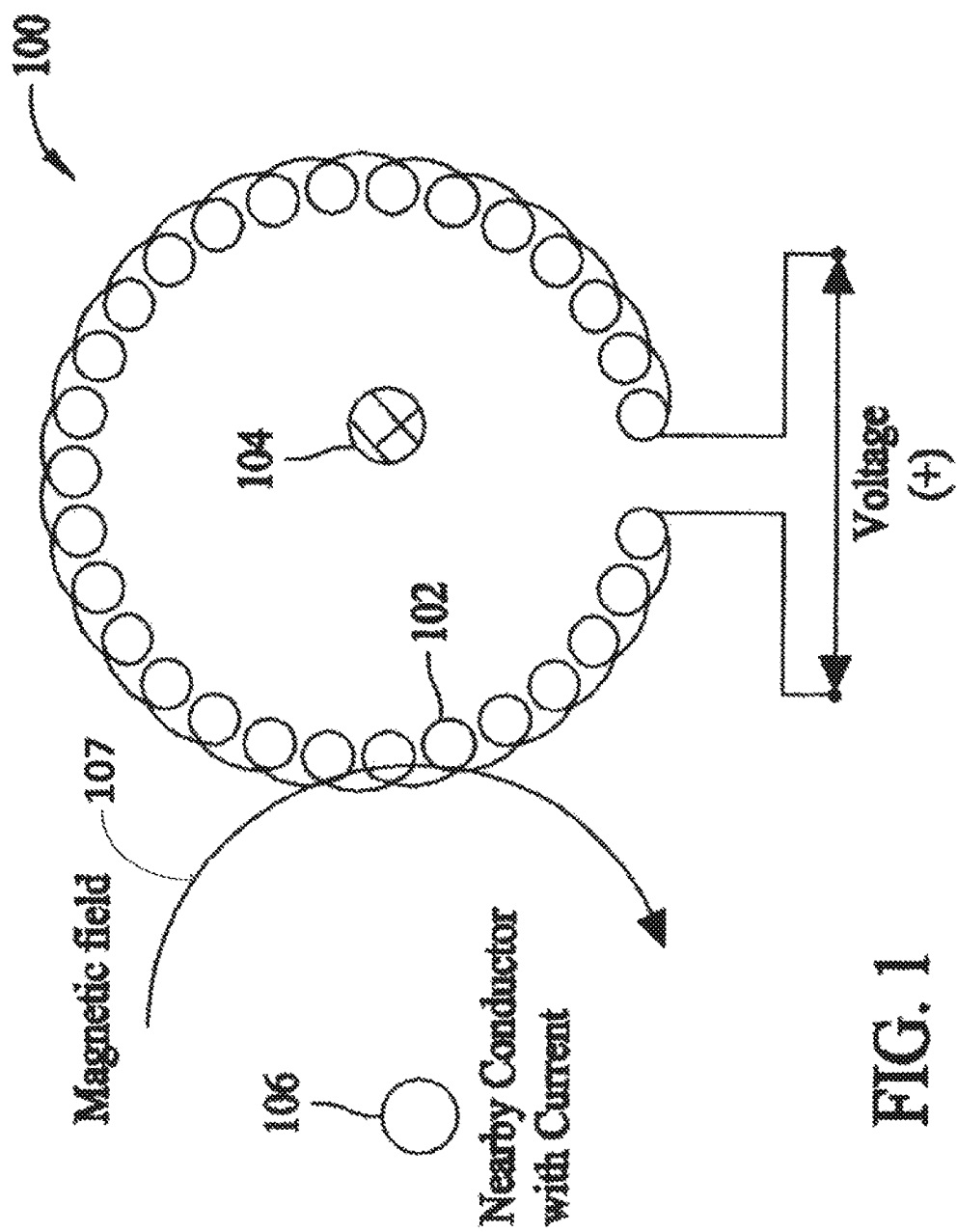
FIG. 1 illustrates a Rogowski coil, an internal conductor, and an external conductor.

Referring to FIG. 1, a Rogowski coil 100 is generally fabricated from a conductor 102, that may include a wire, that is coiled or wound on a substantially non-magnetic core, which may be, for example, air or a substantially non-magnetic material. The 102 coil may be placed around a conductor or conductors 104 whose current(s) is to be measured with the coil 102. A primary current flowing through the conductor 104 generates a magnetic field that, in turn, induces a voltage in the coil 102. A voltage output v(t) of the coil 102 is generally governed by the following Equation:

$$v(t) = -\mu_o \mu_r \mu n S [di(t)/dt] = -M [di(t)/dt].$$

where $\mu_o$, is the magnetic permeability of free space, $\mu_r$ is the relative permeability (the ratio of the permeability of the coil 102 to the permeability of free space $\mu_o$), n is the winding density (turns per unit length), S is the cross sectional area of the core in the Rogowski coil, and M represents the mutual reactance or mutual coupling between the coil 102 and the conductor 104. In a similar manner, the output of the coil may be a current signal i(t).

For an ideal Rogowski coil 102, M is independent of the location of the conductor 104 within the coil 102. The Rogowski coil output voltage v(t) is proportional to the rate of change of the measured current i(t) flowing in the conductor 104. The coil output voltage v(t) may be integrated to determine the current i(t) in the conductor 104.

Figure 2A:
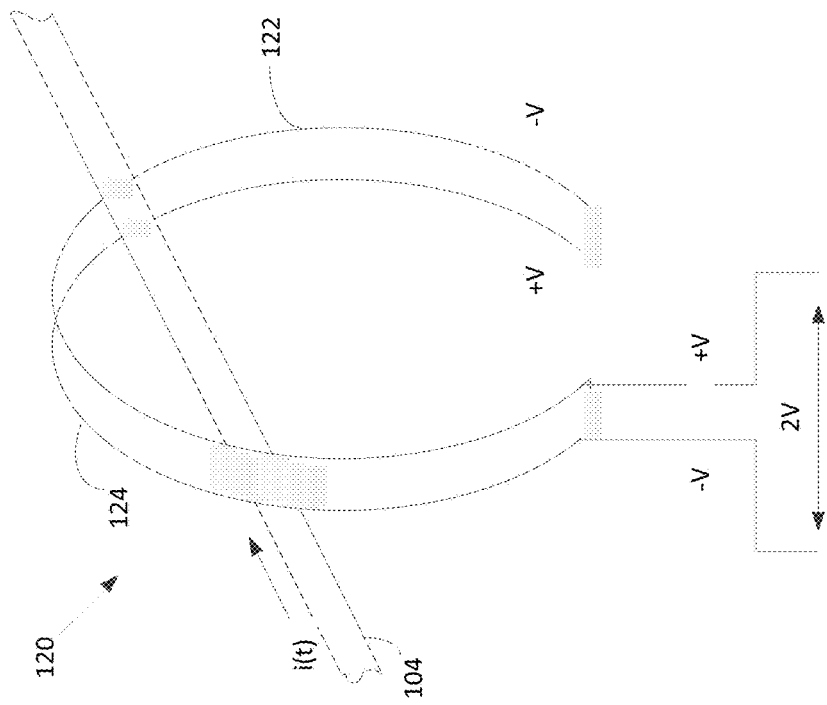
FIG. 2A illustrates a modified Rogowski coil.

Referring also to FIG. 2A, to reduce undesirable influence of a nearby conductor 106, which generates an electromagnetic field 107, a coil 120 may include first and second wire coils or loops 122, 124 wound in electrically opposite directions. The two coils 122, 124 effectively cancel substantially all electromagnetic fields coming from outside the coil 120. One or both loops 122, 124 may be configured from a wound wire on the core. If only one loop wire wound on a non-magnetic core is utilized, then the other loop may be returned through the center of the coil 120 to cancel undesirable effects of external magnetic fields.

Figure 2B:
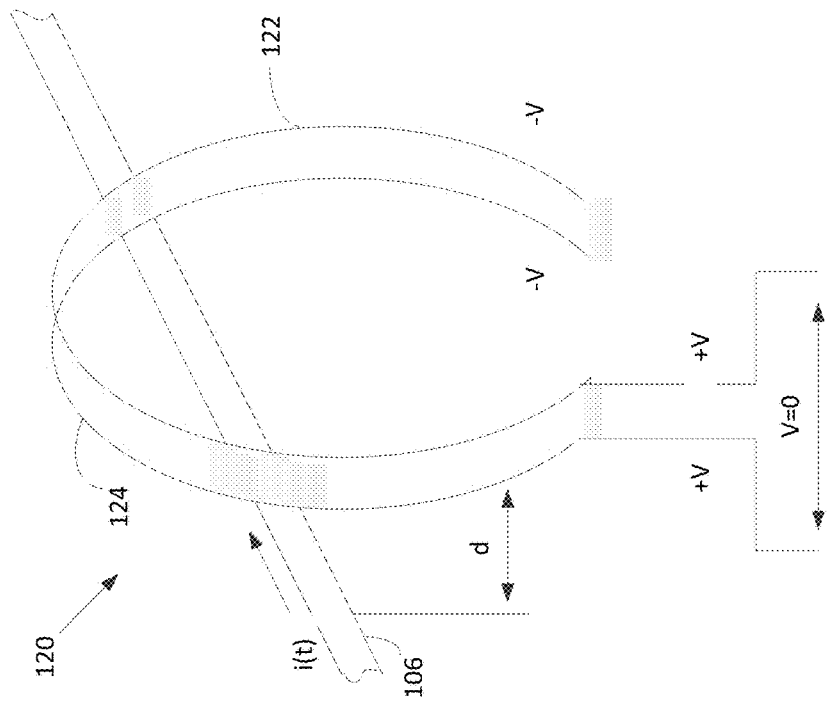
FIG. 2B illustrates a further modified Rogowski coil.

Referring also to FIG. 2B, both loops 122 and 124 may include wound wires, with the second winding 124 being wound in the opposite direction. In this configuration, the voltage induced in the coil 120 from the conductor passing through the coil will be doubled.

Figure 3:
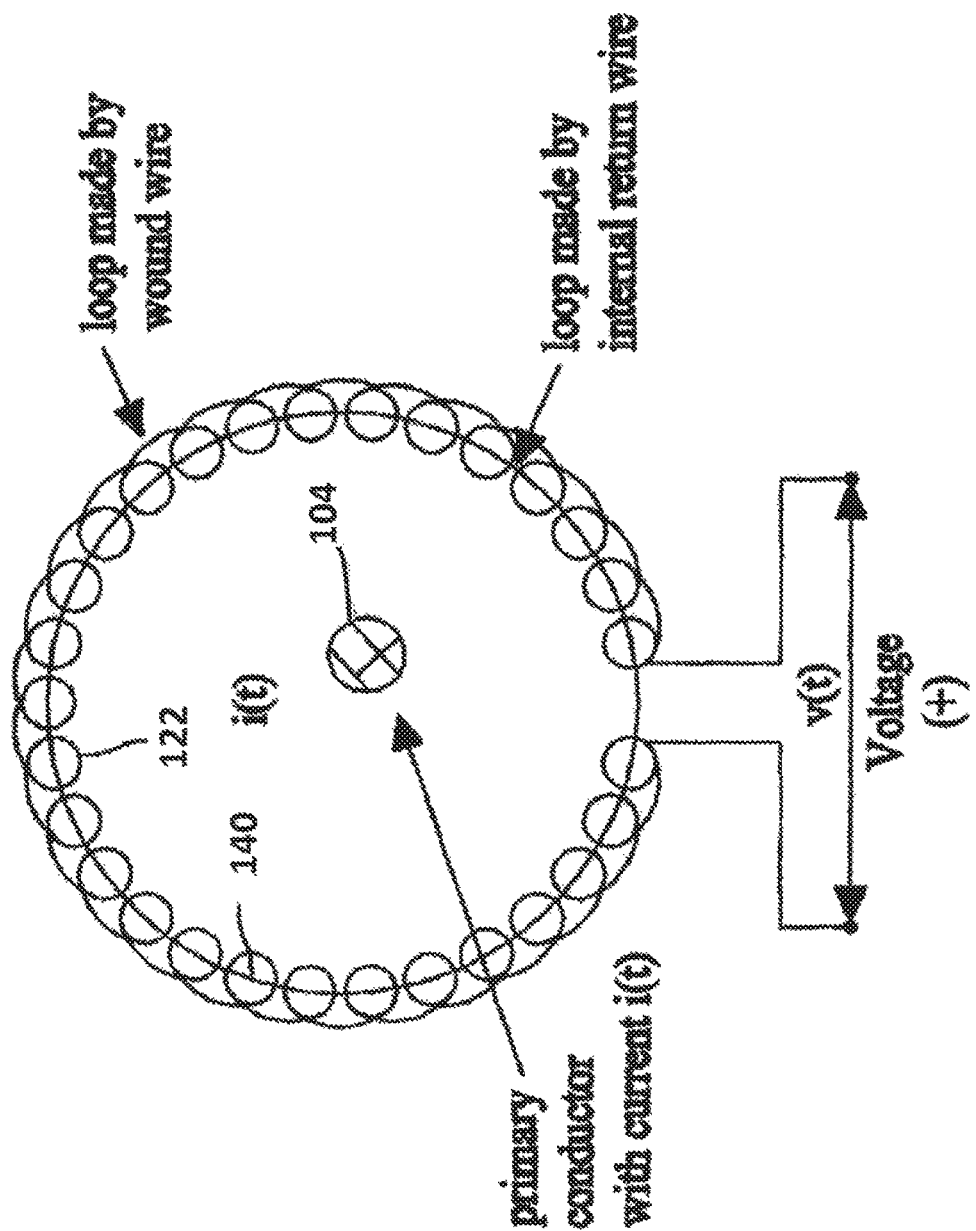
FIG. 3 illustrates a further modified Rogowski coil.

Referring to FIG. 3, a Rogowski coil may include a substantially flexible, nonmagnetic core 140 such as cores commonly used in known coaxial cables. Insulating jackets and shielding from such cables, may be stripped to obtain the cores, and after cutting the cable core to size, the coil 122 (and 124) may be wound over the core 140. Existing conductors extending through the center of the core 140 may serve as the return loop for reduction of external magnetic fields, as described above. In lieu of such flexible cores 140, coils may be fabricated from relatively rigid and straight rods that may be manufactured with a more uniform cross sectional area than the flexible cores. In lieu of such flexible cores 140, coils may be fabricated on dielectric material, such as a patterned circuit board.

The output of the coils tend to be susceptible to noise, signal distortion, and undesirable influences by surrounding conductors and equipment in the vicinity of the coils. To reduce such influences shielding may be included.

Figure 4:
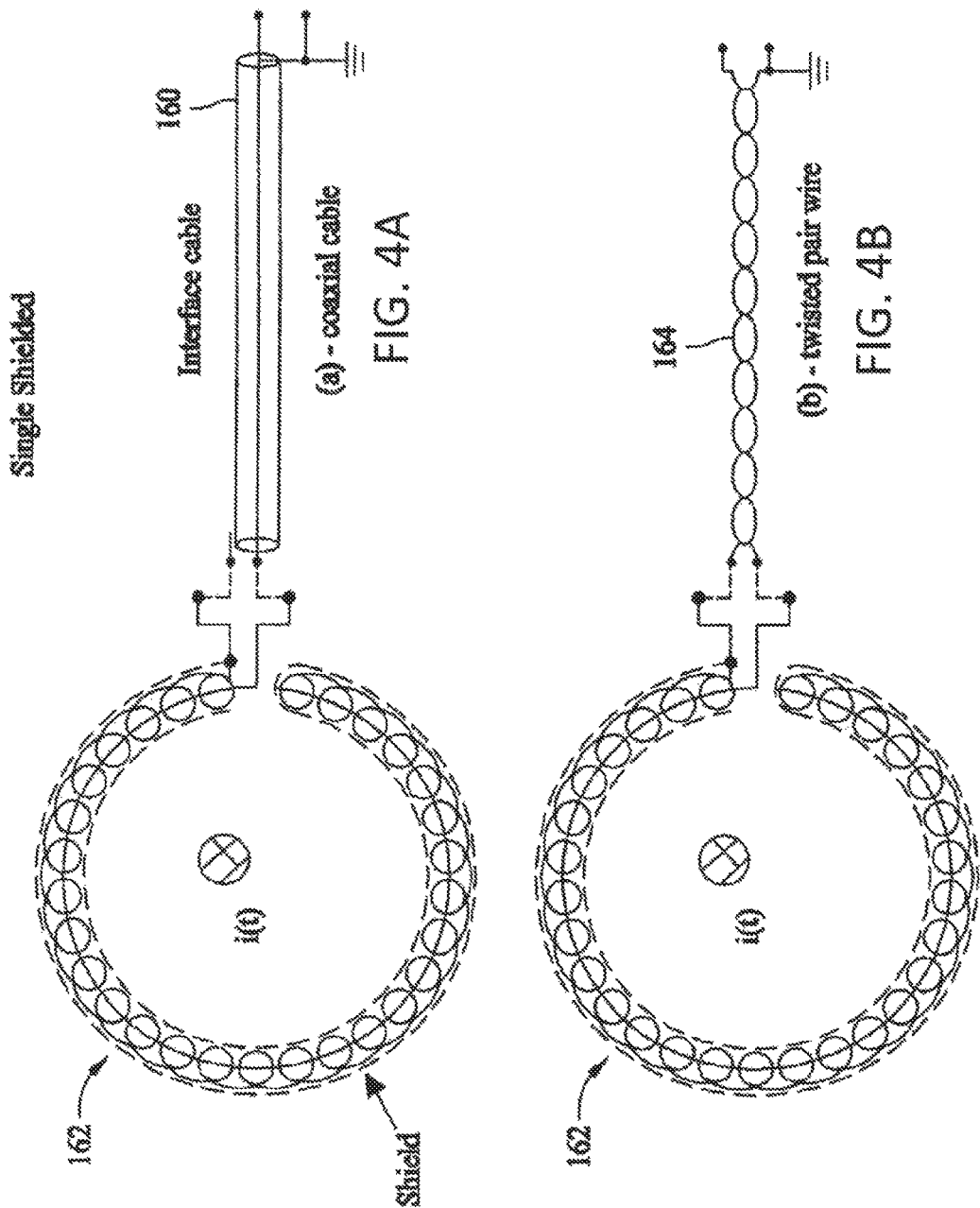
FIG. 4A illustrates a further modified Rogowski coil and connection.
FIG. 4B illustrates a further modified Rogowski coil and connection.

Referring to FIG. 4A, the Rogowski coil and its secondary leads may include a shielded coaxial cable 160 that is connected to a coil 162. Referring to FIG. 4B, a twisted pair wire 164 is connected to the coil 162. The twisted wires carry equal but opposite signals and are less susceptible to noise issues and cross talk issues from adjacent signal conductors. The shielded cable 160 and the twisted pair wire 164 provide protection against noise and electromagnetic influences in the environment of the coils 162.

Figure 5:
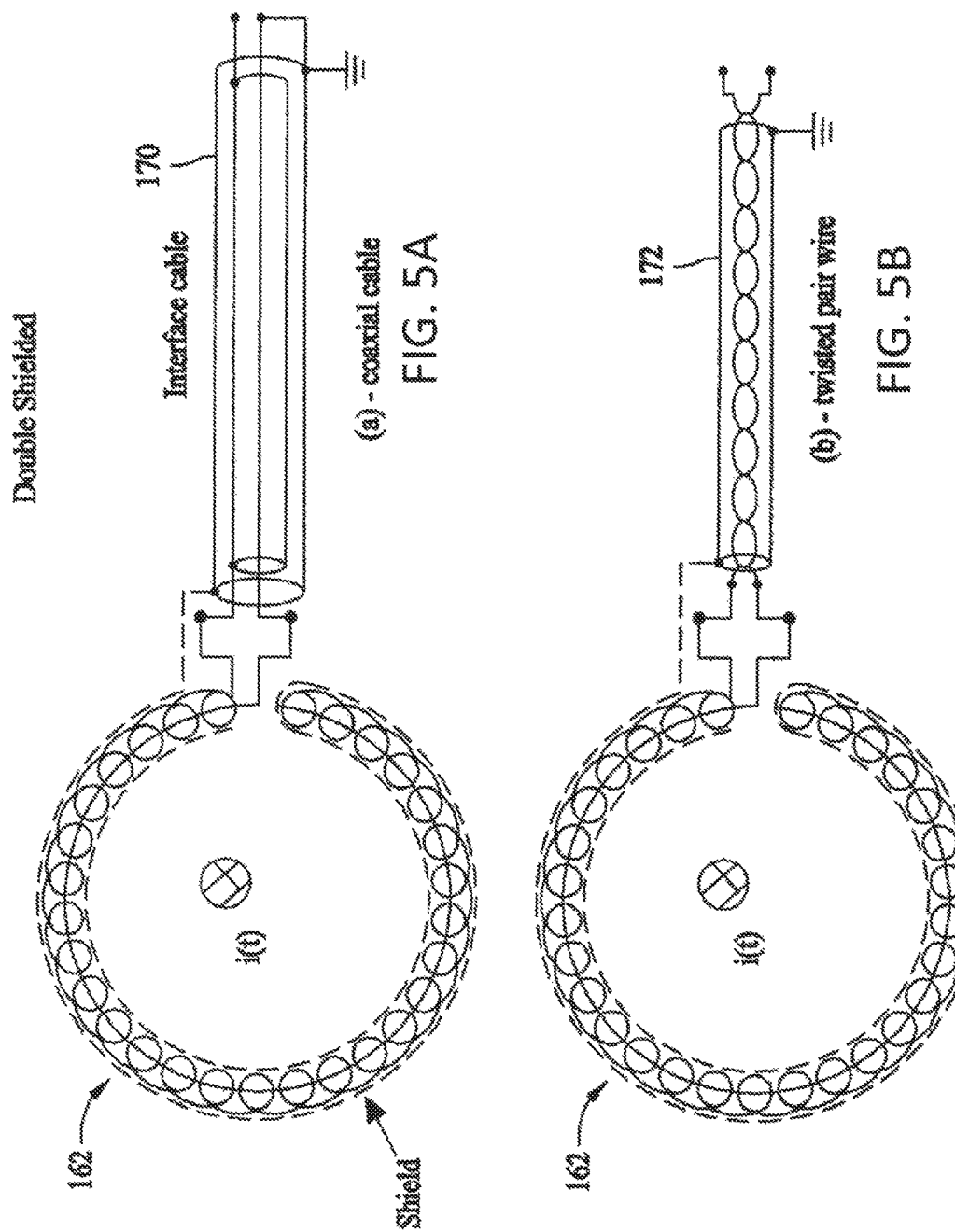
FIG. 5A illustrates a further modified Rogowski coil and connection.
FIG. 5B illustrates a further modified Rogowski coil and connection.

FIGS. 5A and 5B illustrate another approach for improving the integrity of the coil output signals. FIG. 5A illustrates a double shielded cable 170 having concentric layers of insulation around the signal conductors in the cable. FIG. 5B illustrates a shielded twisted pair wire 172. The double shielding shown in FIGS. 5A and 5B are more effective than the single shielding features shown in FIGS. 4A and 4B.

Figure 6:
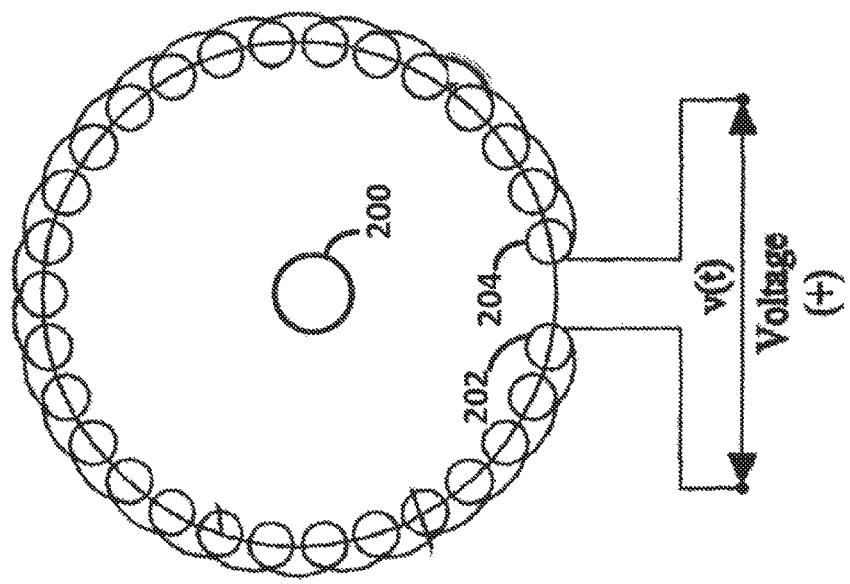
FIG. 6 illustrates a further modified Rogowski coil and connection.
Figure 7:
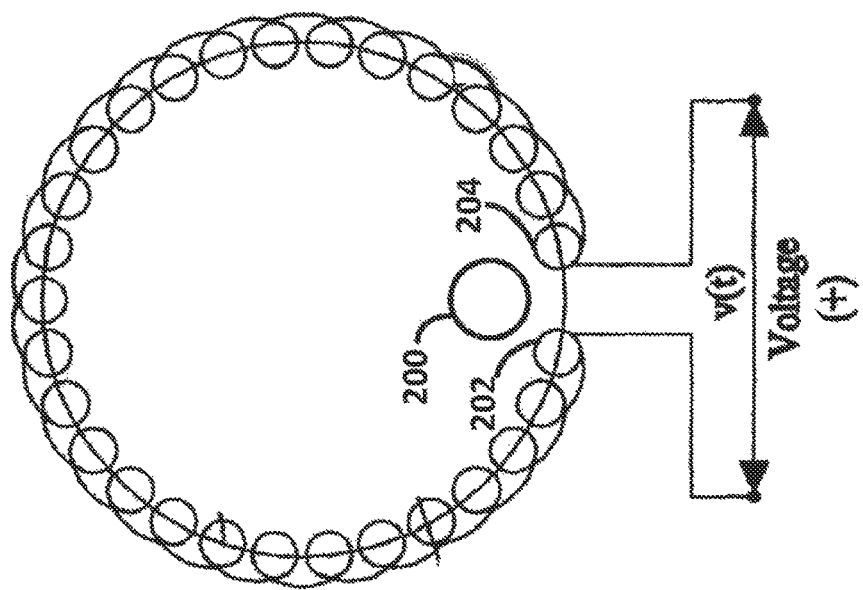
FIG. 7 illustrates a further modified Rogowski coil and connection.
Figure 8:
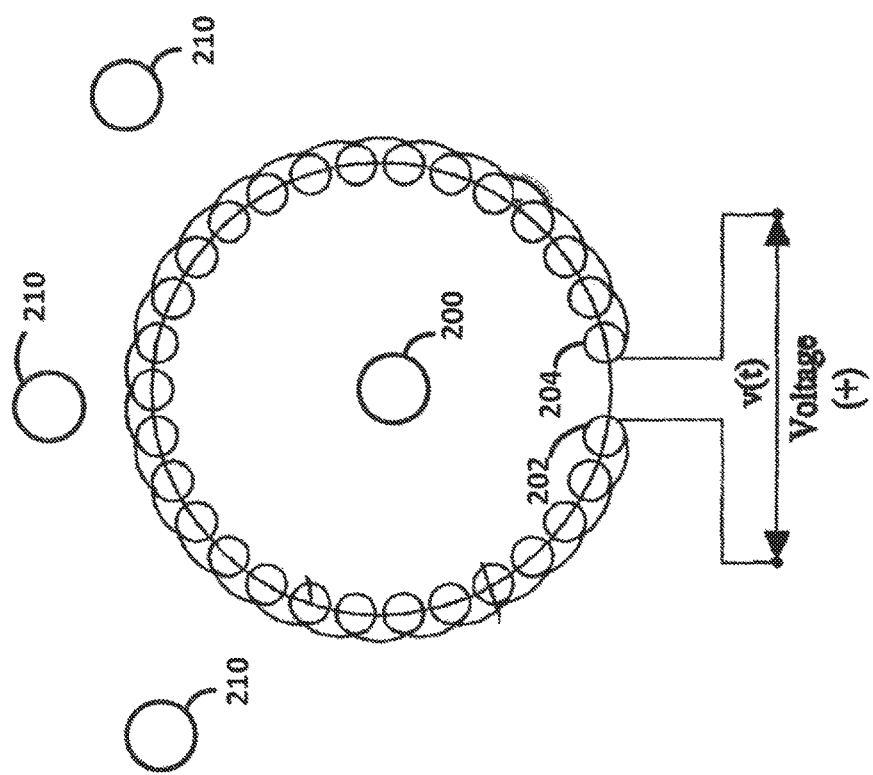
FIG. 8 illustrates a further modified Rogowski coil and connection.

As described, the Rogowski coil may be flexible in shape in order to readily open and close it on the conductor to be measured. This flexibility is especially useful when installing the Rogowski coil around conductors with limited or irregular space constraints. However, the closure system between the ends of the loops from a mechanical perspective (e.g., precision of the positioning of the two ends of the loop) and from an electrical perspective (e.g., the electrical discontinuity of the electrical fields) results in a non-uniformity of the measuring of the fields within the loop. Referring to FIG. 6, a first measurement may be made based upon a first conductor 200 centered within the loop. The measurement will be incorrect due to the non-uniform field created by the closure system between the ends 202, 204 of the loop. Referring to FIG. 7, a second measurement may be made based upon the first conductor 200 located proximate the closure system within the loop. The measurement will be incorrect due to the non-uniform fields created by the closure system within the loop. Referring to FIG. 8, the measurement tends to be incorrect, even with external fielding canceling techniques, due to the non-uniform field created by one or more external conductors 210 in addition to the non-uniform field created by the closure system between the ends 202, 204 of the loop.

Figure 9:
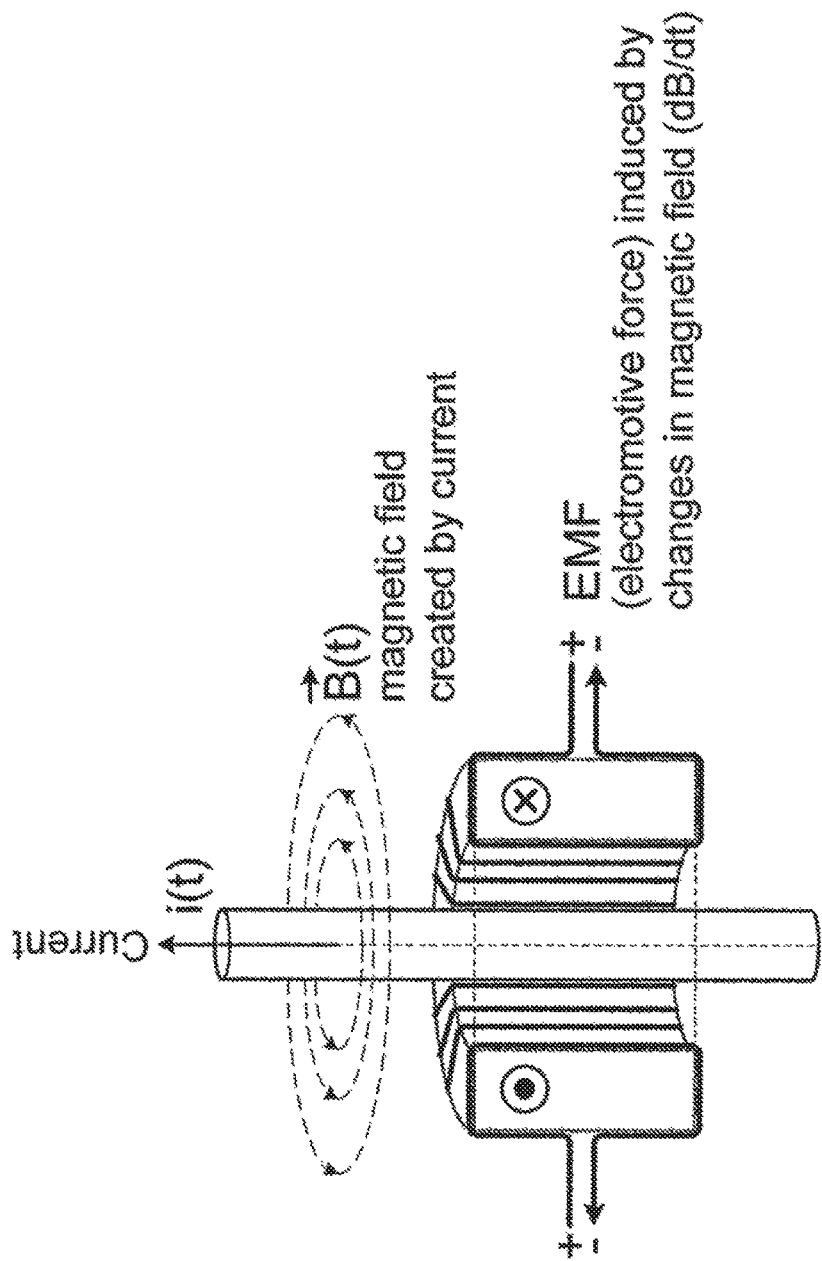
FIG. 9 illustrates a Rogowski coil and its electromotive force.

Referring to FIG. 9, an exemplary diagram of a Rogowski coil arranged around a long straight wire perpendicular to the magnetic field is shown, illustrating the magnetic field (B field) generated by the current i(t). Moreover, as previously described, the EMF may be generally determined by EMF=−Md(i)/dt.

Figure 10:
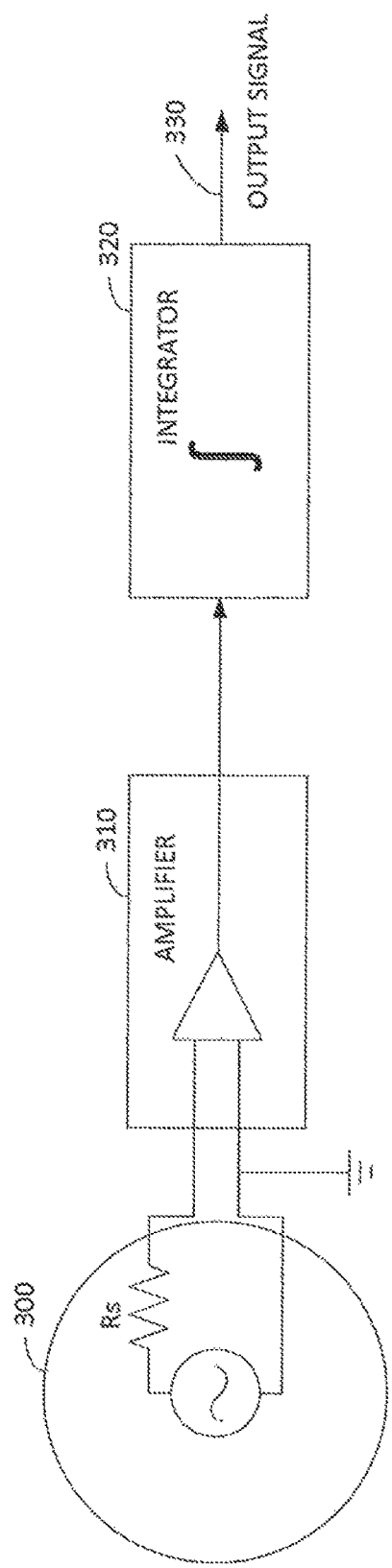
FIG. 10 illustrates a Rogowski coil, together with an amplifier and an integrator.

Referring to FIG. 10, since the output signal from the Rogowski coil 300 tends to be relatively small the signal is preferably amplified using a suitable amplification circuit 310. The output of the amplification circuit 310 is then preferably integrated using an integrator 320 to provide an output signal 330 indicative of the current. The integrator 320 preferably includes compensation for a 90 degree phase shaft and a 20 dB/decade gain generated by the Rogowski coil. It is to be understood that the amplification and/or integration may be performed using firmware using any computing process.

Figure 11:
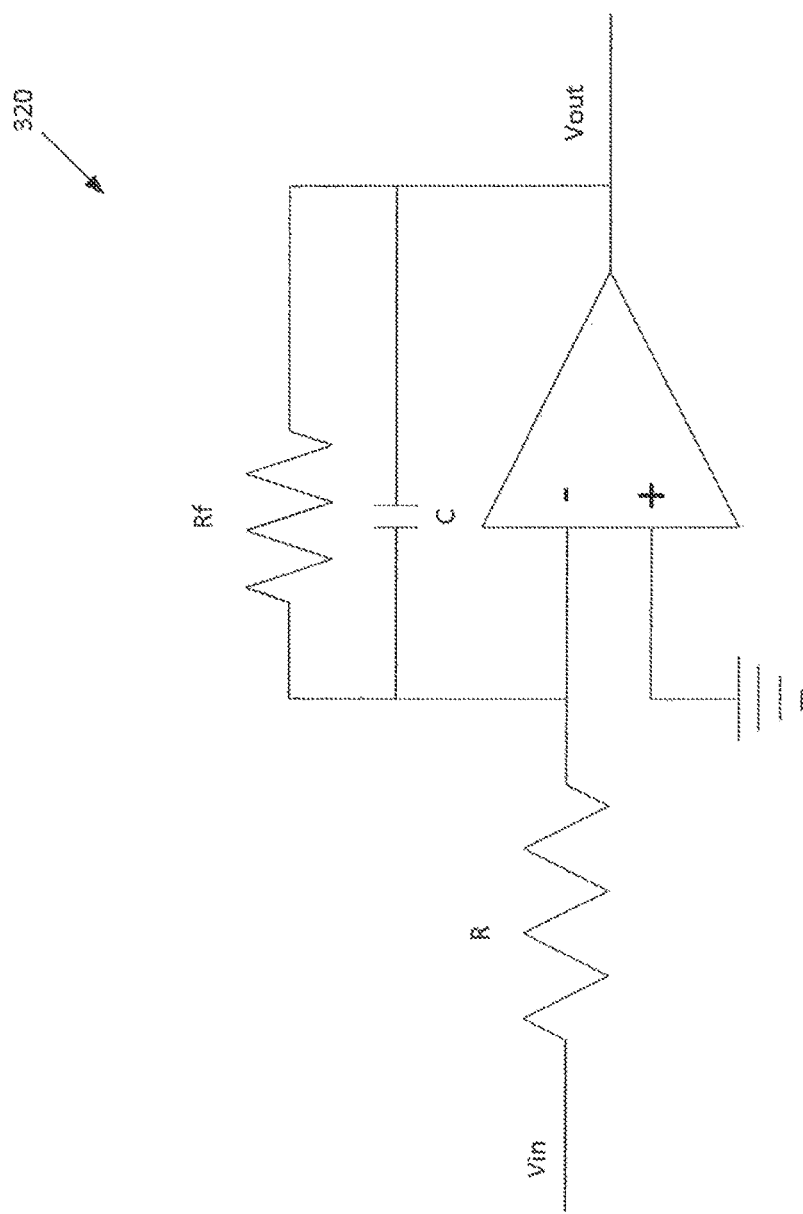
FIG. 11 illustrates an integrator.

Referring to FIG. 11, an exemplary integrator 320 may include an inverting operational amplifier and a resistor-capacitor circuit.

Figure 12:
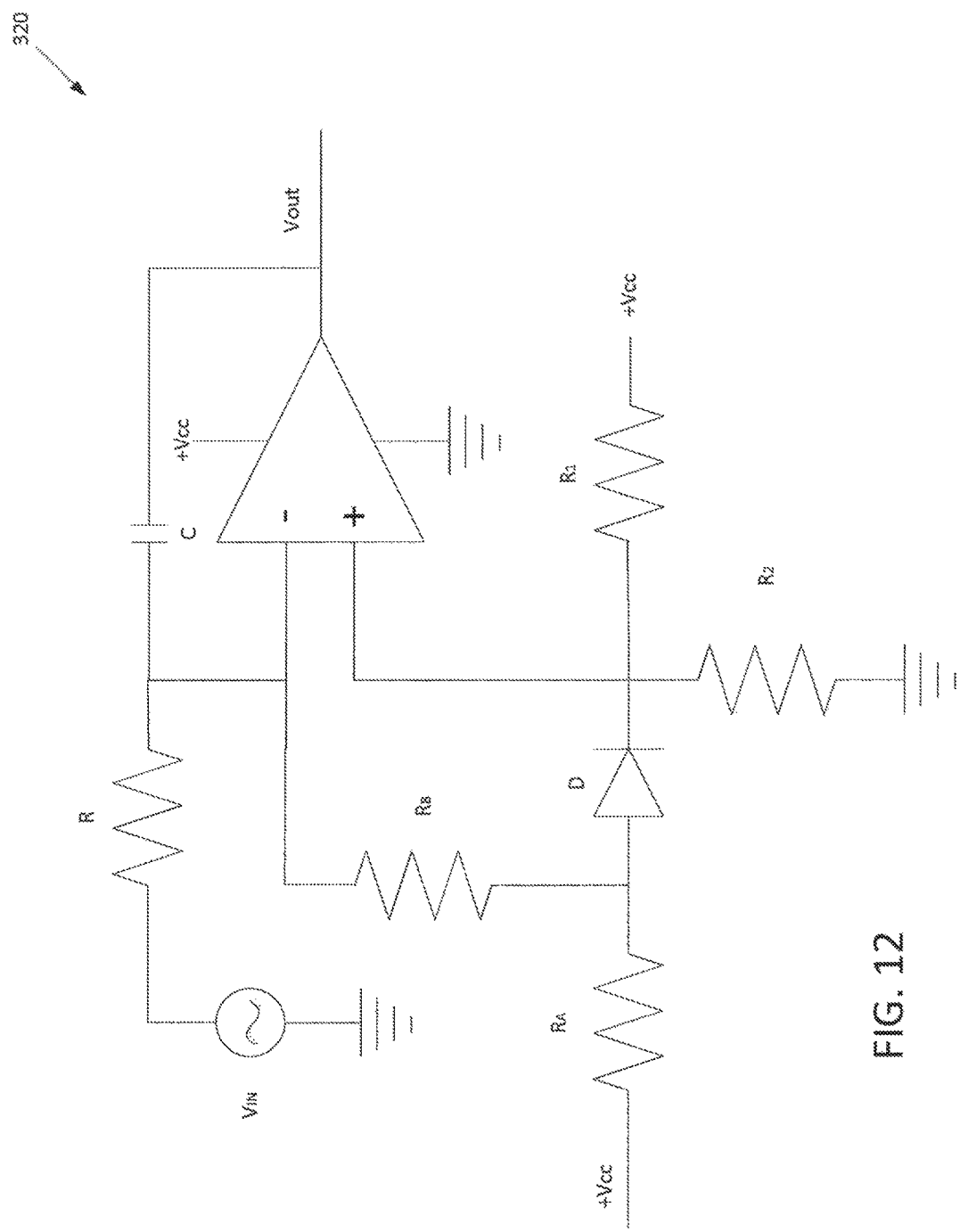
FIG. 12 illustrates another integrator.

Referring to FIG. 12, an exemplary integrator 320 may include an operational amplifier with input current compensation. The resistors R1 and R2 are relatively small, and the resistor $R_B$ is relatively large.

Figure 13:
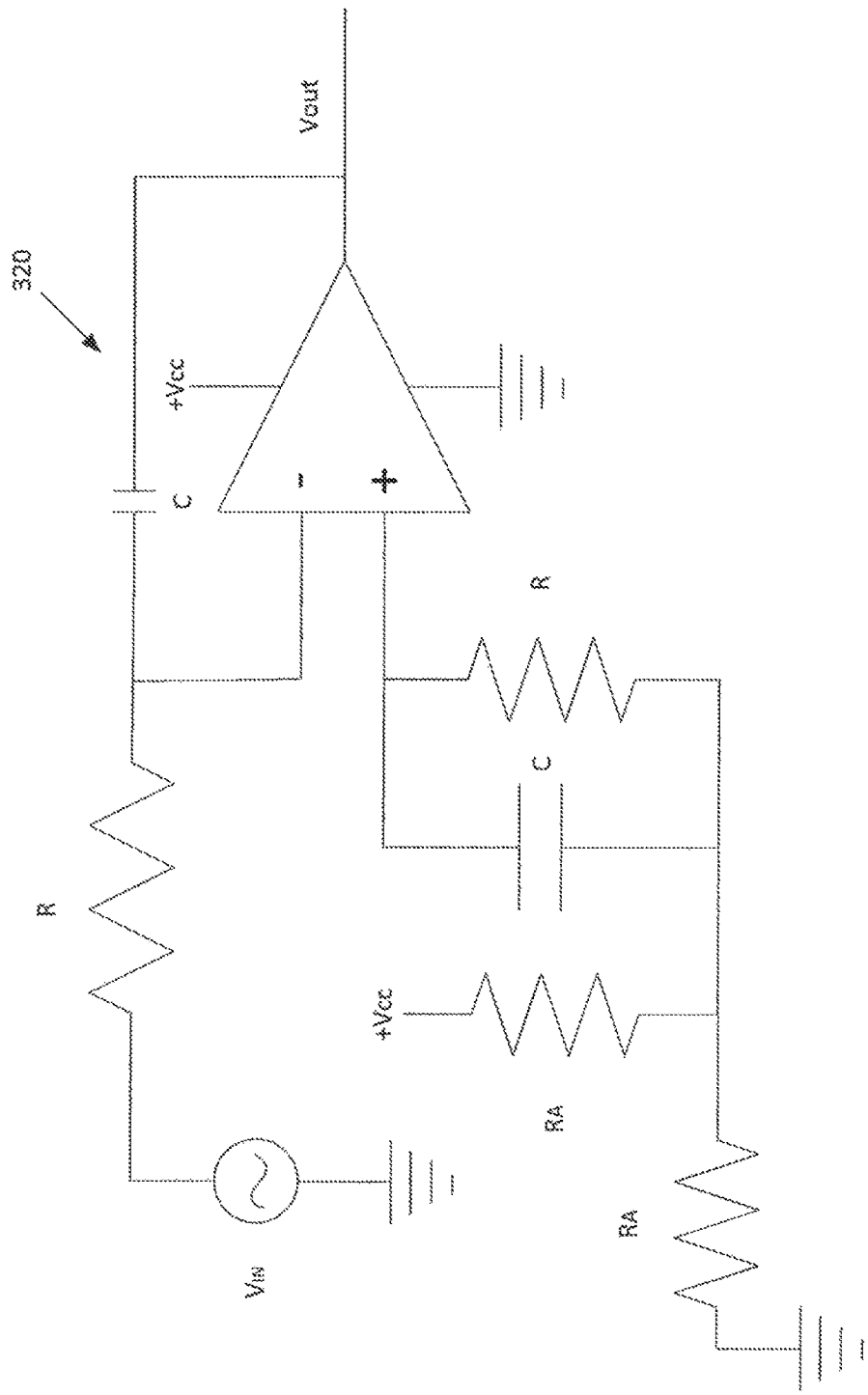
FIG. 13 illustrates another integrator.

Referring to FIG. 13, an exemplary integrator 320 may include an operational amplifier with drift compensation. The positive input current drops the same voltage across the parallel RC combination as the negative input current drops across its series RC combination.

Figure 14A:
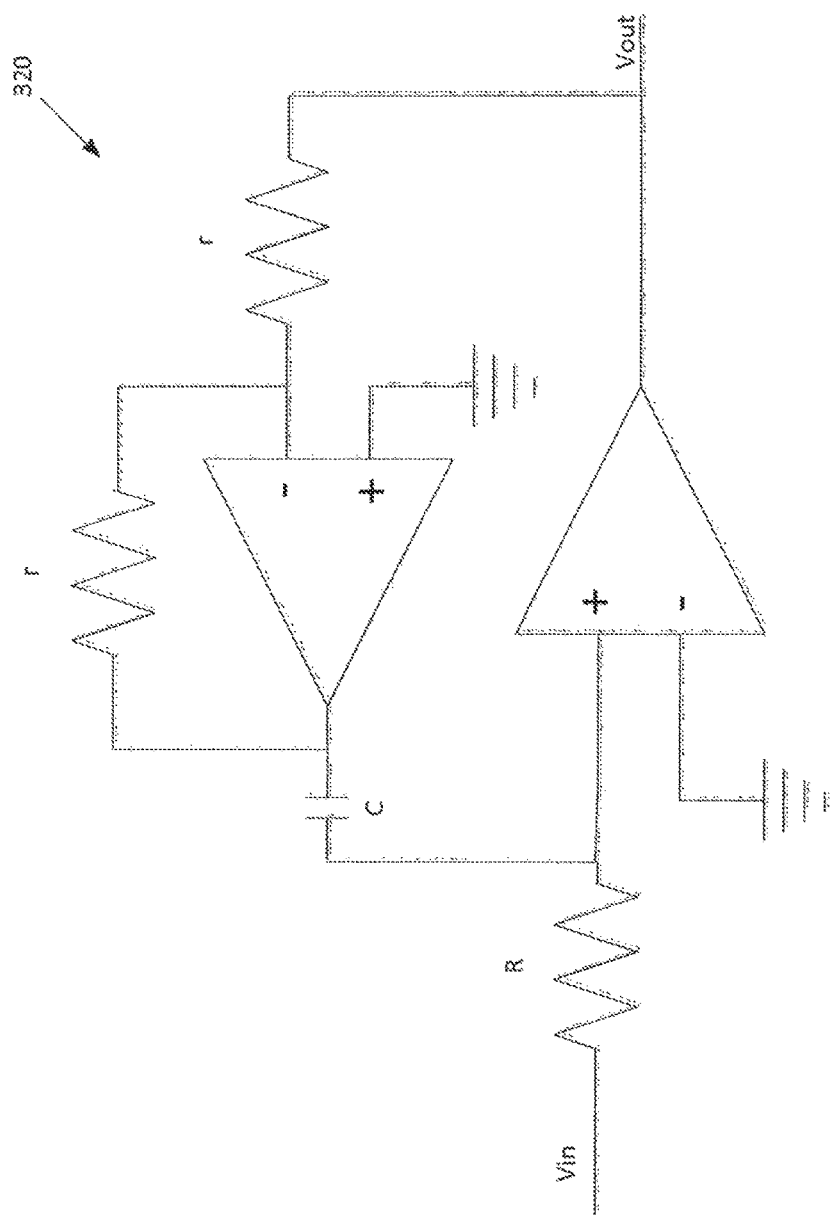
FIGS. 14A-B illustrate other integrators.
Figure 14B:
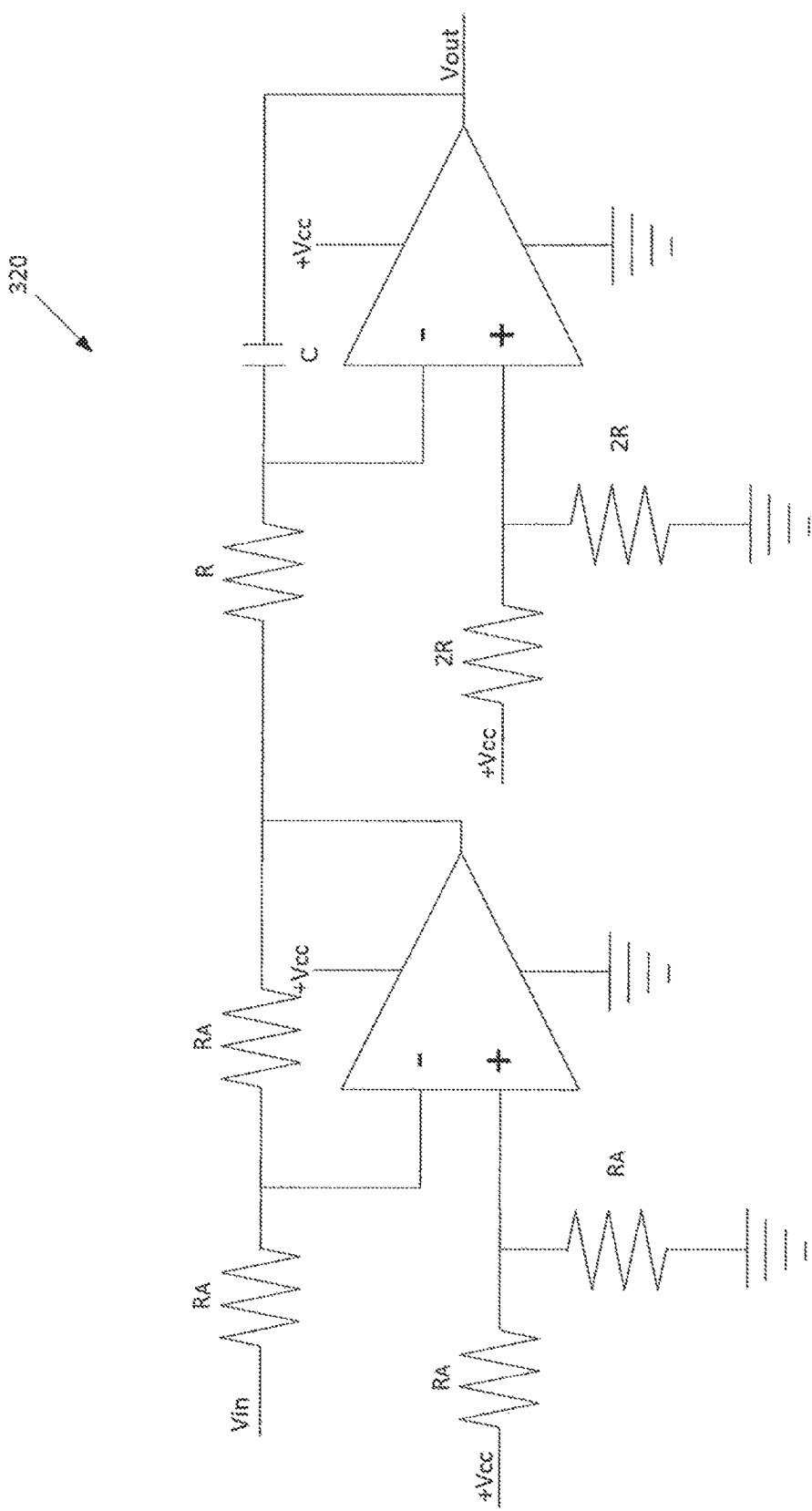

Referring to FIGS. 14A-B, an exemplary integrator 320 may include two operational amplifiers with a non-inverting integrator and an inverting buffer.

Figure 15:
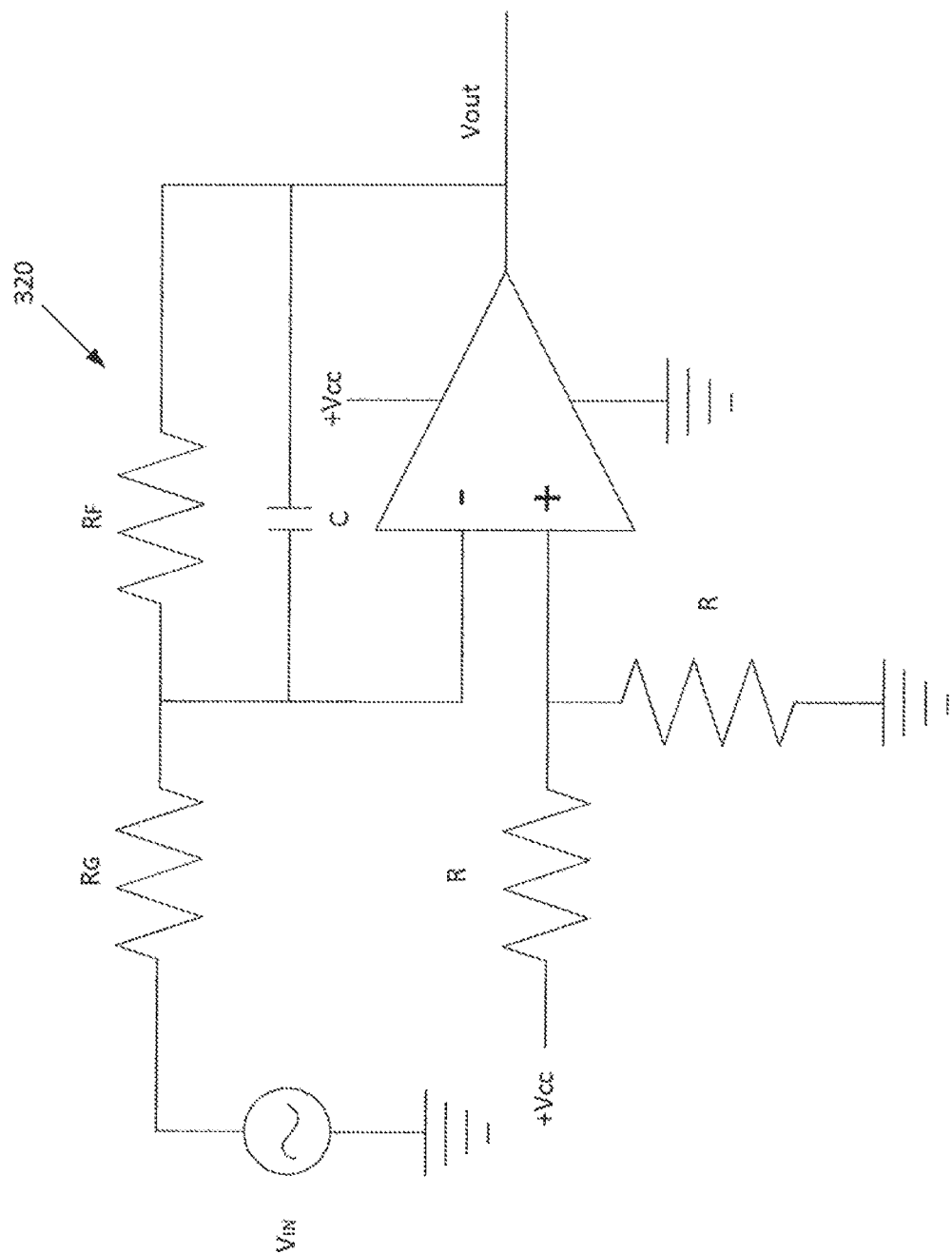
FIG. 15 illustrates another integrator.

Referring to FIG. 15, an exemplary integrator 320 may include an operational amplifier with an inverting integrator with a resistive reset.

Figure 16:
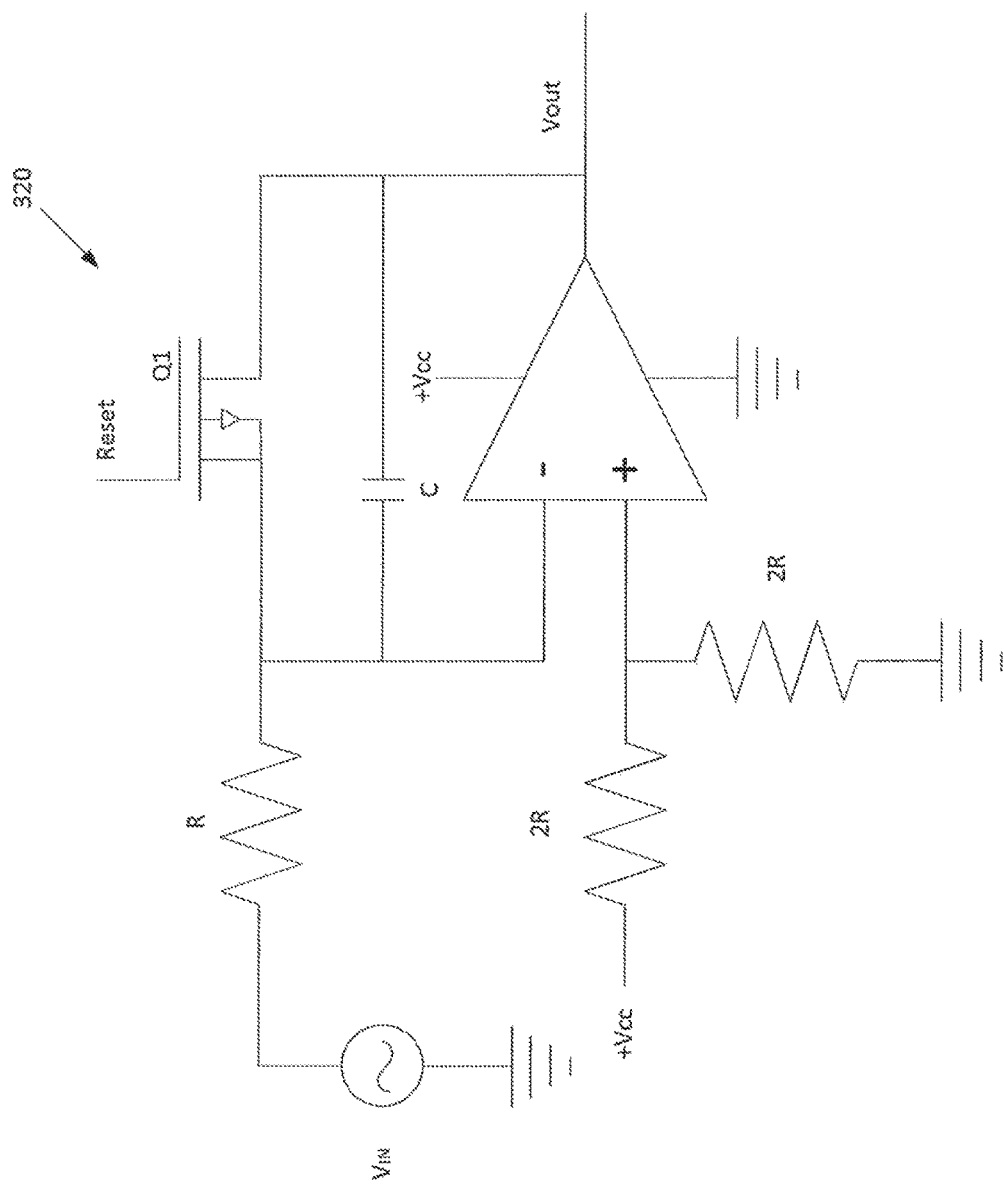
FIG. 16 illustrates another integrator.

Referring to FIG. 16, an exemplary integrator 320 may include an operational amplifier with an inverting integrator with an electronic reset.

It is to be understood that other active circuits may likewise be used, as desired. It is to be understood that a digital integrator may be used, if desired. It is to be understood that passive circuits may likewise be used, as desired.

Figure 17:
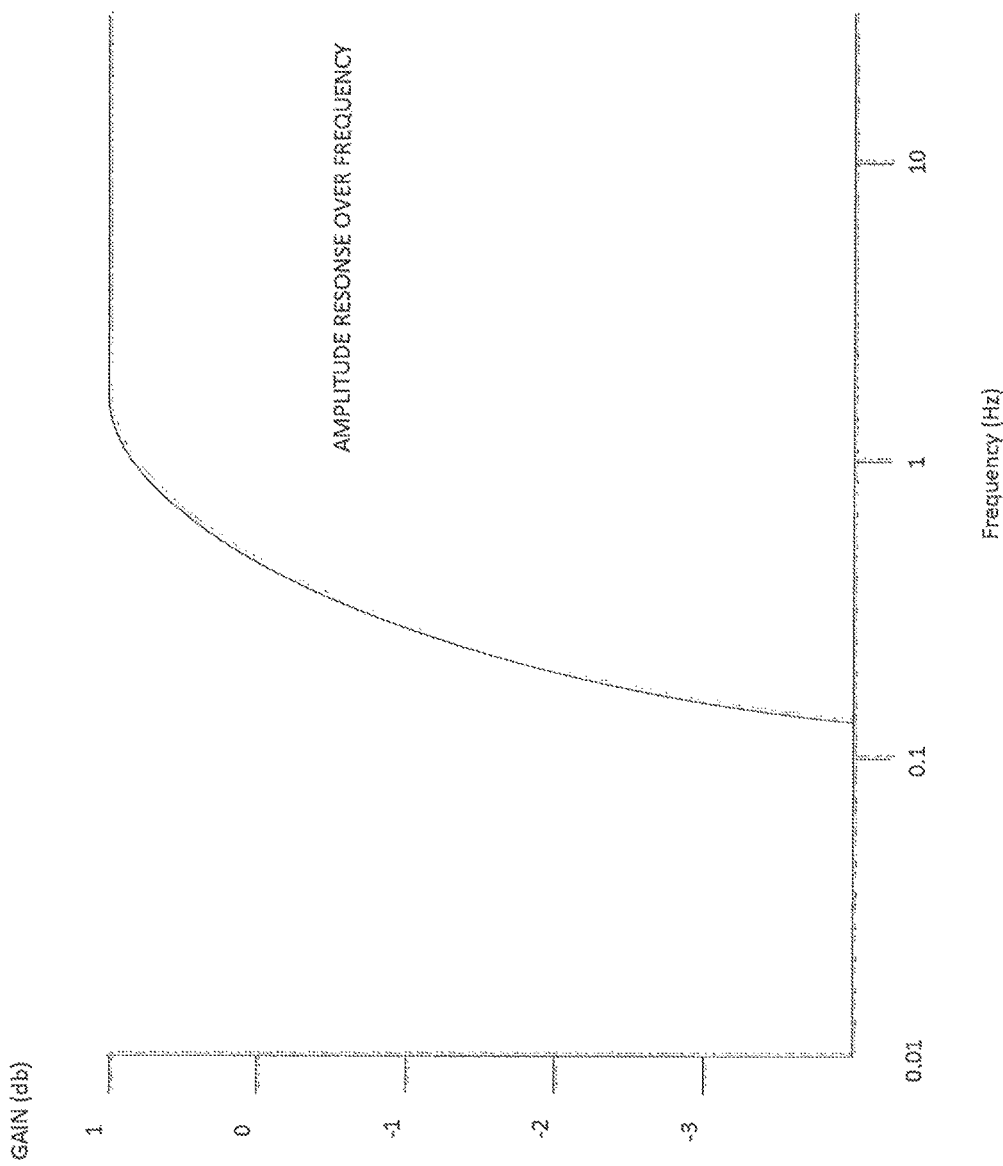
FIG. 17 illustrates an amplitude response of a Rogowski coil.

Referring to FIG. 17, the Rogowski coil tends to have a relatively wide bandwidth that provides a relatively flat sensitivity (e.g., V/A) together with a small phase error over a relatively wide range of frequencies. However, at relatively low frequencies, such as less than 20 Hz, the gain tends to vary. The gain is generally linear over a narrow frequency range for the lower frequencies, but near the 20 Hz frequency range has substantial non-linearity. Accordingly, the amplitude response has substantial non-linearity. The output typically is a slope (gain at uV/A which is a function of frequency) times current.

Figure 18:
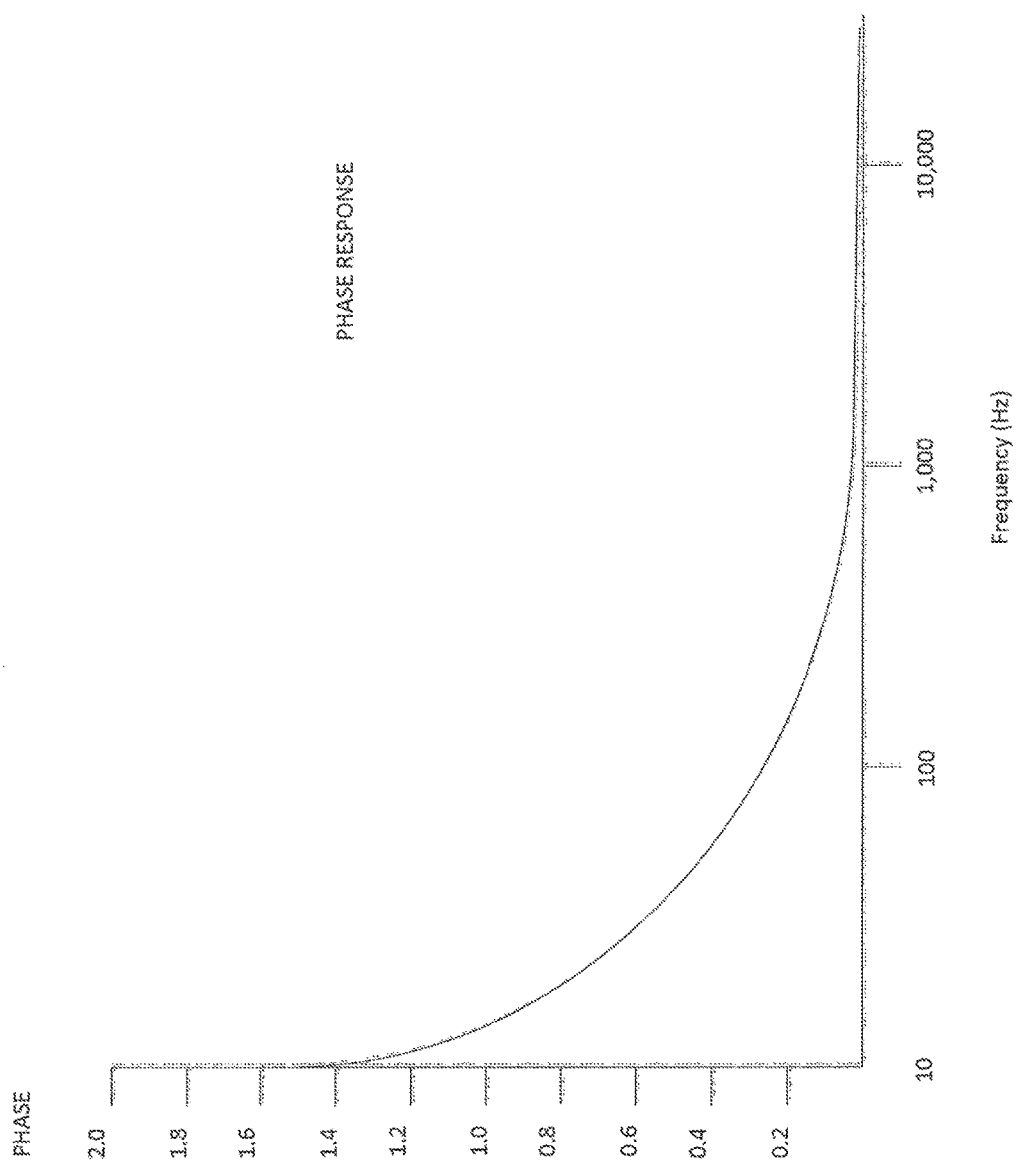
FIG. 18 illustrates a phase response of a Rogowski coil.

Referring to FIG. 18, the Rogowski coil tends to have a variable phase response at different frequencies, especially below 20 Hz. At the greater frequencies, such as at frequencies greater than 10 KHz, the phase error tends to be characterized by the dynamics of the Rogowski coil, its connecting cables, and the integration circuitry. Accordingly, the phase response has substantial non-linearity.

In some cases, the signals in the wires being sensed by the Rogowski coil tend to include signals in addition to the primary signal, such as 60 Hz. These additional signals may be the result of electronic equipment, especially those that convert AC power to DC power as part of its steady state operation. Often many of the more prominent harmonics include the $1^{st}$ harmonic (e.g., 120 Hz), the third harmonic (e.g., 180 Hz), the seventh harmonic (420 Hz), the thirteenth harmonic (e.g., 780 Hz), and the thirty first harmonic (e.g., 1,860 Hz). In the case that the primary signal in the conductor has a substantially greater frequency, then the harmonics tend to be substantially higher. Each of the harmonics includes power that is being provided within the wires. Accordingly, using a single compensation value to account for the gain and a single compensation value to account for the phase shift, will only be accurate at a single frequency value but will be inaccurate at other frequencies, such as the harmonic content.

Figure 19:
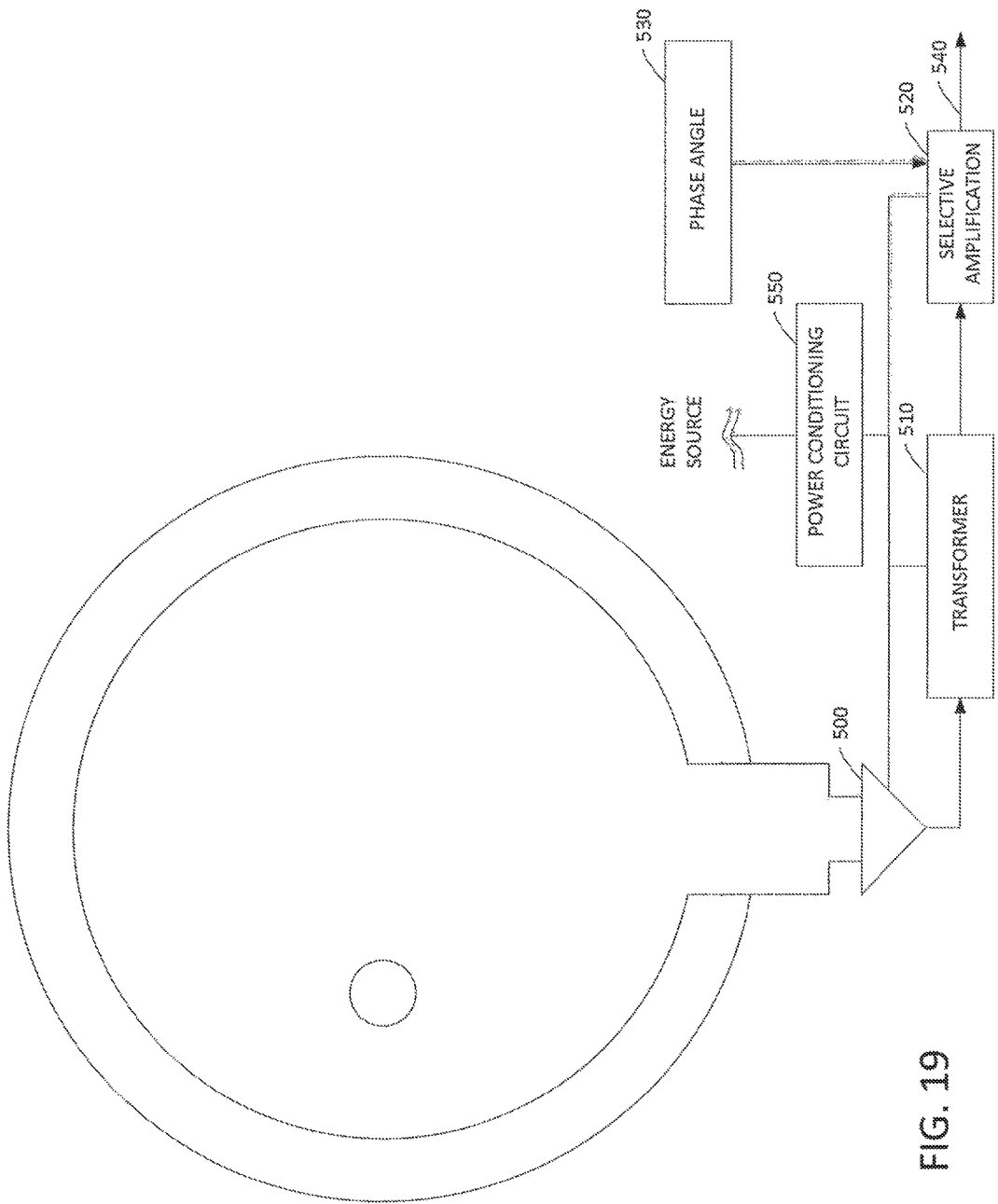
FIG. 19 illustrates a Rogowski coil together with selective amplification.

Referring to FIG. 19, the output of the Rogowski coil may be amplified by an amplifier 500, if desired. Preferably, the amplifier 500 has a linear amplification over a wide range of frequencies. The output of the amplifier 500, if included, may be processed by a transformer 510 to transform the signal from the linear domain to the frequency domain, such as using a fast Fourier transform. A selective amplification 520 may be used to normalize the different frequency ranges of the amplified and transformed signal. For example, a range of frequencies proximate the primary may be amplified by a first factor, a range of frequencies proximate the first harmonic may be amplified by a second factor, a range of frequencies proximate the third harmonic may be amplified by a third factor, a range of frequencies proximate the seventh harmonic may be amplified by a fourth factor, a range of frequencies proximate the thirteenth harmonic may be amplified by a fifth factor, a range of frequencies proximate the thirteenth harmonic may be amplified by a sixth factor. Other ranges of frequencies may likewise be used to adjust for the variable gain of the Rogowski coil. In other cases a continuous function may be used to adjust for the variable gain of the Rogowski coil. In other cases, a non-linear amplifier 500 may be used to adjust for the variable gain of the Rogowski coil. An integration circuit may also be included, if desired.

A power conditioning circuit 550 may be used to provide power to other components, such as the amplifier 500, the transformer 510, and the selective amplification 520. The power conditioning circuit 550 may obtain its power for any suitable source, such as for example, the output of the Rogowski coil, a separate ferrite based coil attached to a conductor, or any other power source.

The selective amplifier 520 may also provide a corresponding phase angle 530 from a memory storage device together with the corrected amplitudes for each of the frequency ranges. In this manner, the output 540 of the selective amplification may include frequency adjusted signals together with one or more corresponding phase angles for the frequency adjusted signals.

Figure 20:
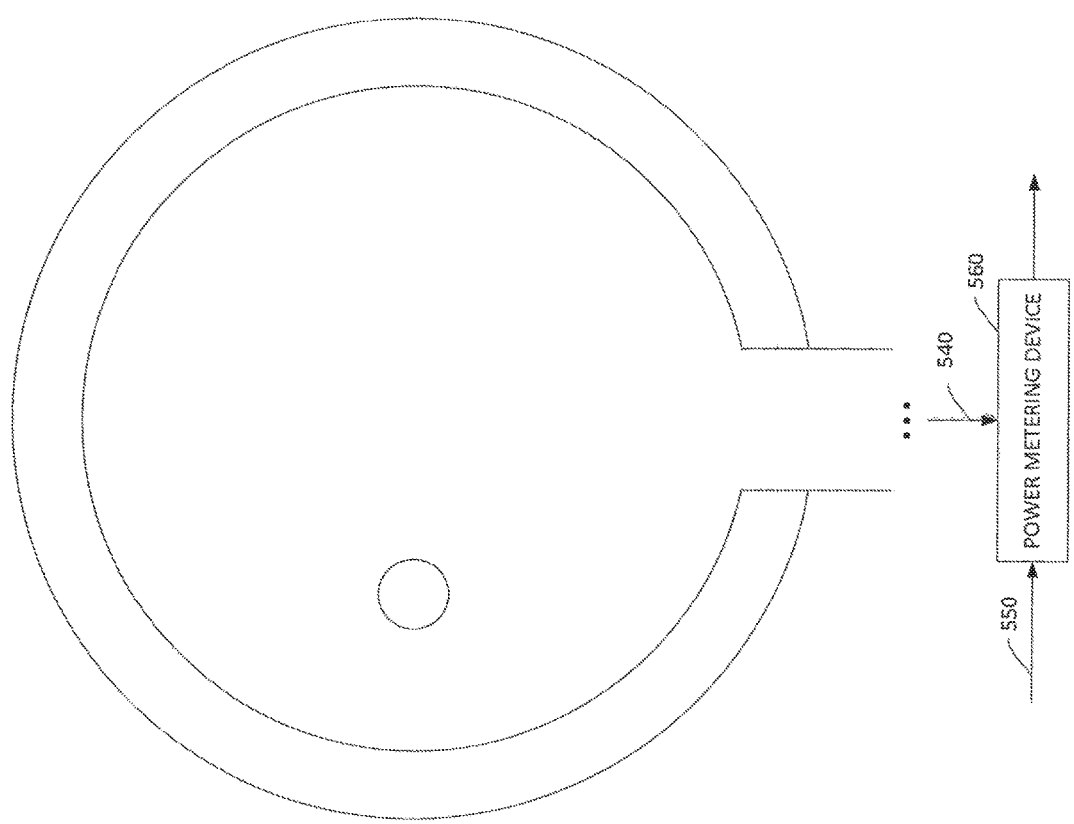
FIG. 20 illustrates a Rogowski coil together with a power metering device.

Referring to FIG. 20, the output 540 of the Rogowski coil which is representative of the current levels in the conductor may be combined with a signal corresponding to the corresponding voltage signal 550 so that voltage signals and power signals may both be available to compute the power in the conductor, namely, the current multiplied by the voltage. If desired, the voltage value may be selected or otherwise inferred. In one mode, a power metering device 560 may multiple the voltage by a frequency compensated signal for the sensed current. In this manner, the different frequency effects of the Rogowski coil may be suitably characterized. For example, the frequency compensated signal for the sensed current may be a substantially continuous adjustment for the different frequency components of the sensed current signal by the Rogowski coil, and in this manner accommodates for the power at all of the frequency aspects of the sensed signal. For example, a simplified frequency compensated signal for the sensed current may use a bandwidth limited frequency band. The bandwidth limited frequency band may be, for example, 0-1 KHz, 0-4 KHz, 0-10 KHz, 0-20 KHz, 40 Hz-70 Hz, 300 Hz-500 Hz, or 200 Hz-8 KHz. A user selectable frequency band selection, such as using a setting in the power metering device, facilitates power calculations over a known frequency band which tends to eliminate spurious signals above the anticipated frequency range (or harmonics) to provide a more useful power value.

In addition to the amplitude compensated signals based upon frequency, the power metering device 560 may likewise include the phase angle (e.g., power factor) offset in its calculation. The phase angle may be a single value or may be multiple (or continuous) values based upon the applicable frequency being applied. In this manner, the frequency effects of the phase angle shift based upon the Rogowski coil may be compensated for. For example, the power may be calculated as "voltage" multiplied by "current" multiplied by "phase angle" to determine the power.

In military applications, the base frequency is often 400 Hz so that many of the components can more readily be more compact in size. Other systems also tend to use a higher base frequency to even further reduce the size of the components. Such systems tend to have significant even higher frequency harmonics than those with 50-60 Hz base frequencies, and it may be desirable to more accurately determine the base frequency energy and/or the lower frequency harmonics. Also, the power metering device may calculate a harmonic distortion of signal as a ratio of the sum of the power of all or a portion of the harmonic components to the power of the fundamental frequency. This provides an indication of the power quality of the electrical system. Also, the system may include a plurality of corresponding Rogowski coils. For example, using two Rogowski coils the two-phase power to a load may be determined. For example, using three Rogowski coils the three-phase power to a load may be determined. The power metering device 560 in this case would receive a corresponding signal for each of the currents, and preferably receive a corresponding signal for each of the voltages (if not inferred or otherwise inferred based upon receiving a voltage signal from less than all of the phases).

Referring to FIG. 21, the Rogowski coil tends to vary in its output with temperature in a generally linear fashion although it is non-linear over temperature. In addition, the output of the Rogowski coil tends to further vary in its output with temperature together with the magnitude of the signal within the conductor, either in its voltage and/or current. In this manner, a single function may be used to characterize the temperature characteristics of the Rogowski coil, which may be a single value or a series of values and/or a continuous function. In this manner a family of functions may be used to characterize the temperature characteristics of the Rogowski coil based upon the applied current and/or voltage, which may be a single value or a series of values and/or a continuous function. The power metering device may adjust its output based upon the sensed temperature 570 which may be provided from a temperature sensor 580 that is preferably affixed to the Rogowski coil. The temperature sensor 580 may also be included together with the Rogowski electronic components. The temperature sensor 580 may be a separate device that senses the temperature in the vicinity of the Rogowski coil. The temperature sensor 580 may be self-powered, powered by the Rogowski coil, or powered by any suitable power source.

In another embodiment a conductive based core, such as a ferrite core, may be used as the current transformer. In addition, the current transformer may be a solid core or a split core current transformer.

It is to be understood that the claims are not limited to the precise configuration and components illustrated above. Various modifications, changes and variations may be made in the arrangement, operation and details of the systems, methods, and apparatus described herein without departing from the scope of the claims.

The invention claimed is:
1. A coil for sensing a changing current comprising:
(a) an elongate substantially flexible core material, said elongate substantially flexible core material having a first end portion and a second end portion, said elongate substantially flexible core material having a first middle portion between said first end portion and said second end portion, said second end portion at an opposite end of said first elongate substantially flexible core material than said first end portion;

(b) an elongate conductive member encircling said first middle portion of said substantially flexible core material;

(c) a coupler that interconnects said first end portion and said second end portion of said substantially flexible core material;

(d) a sensing module that receives an input signal from said elongate conductive member and determines a conductor signal within a conductor at least partially encircled within said elongate substantially flexible core material based upon said input signal;

(e) said sensing module modifying said input signal based in a first manner for a first frequency range based upon a primary signal frequency of said input signal and in a second manner for a second frequency range based upon a first harmonic of said primary signal frequency.

2. The coil of claim 1 wherein said elongate substantially flexible core material is substantially round in cross section.

3. The coil of claim 2 wherein said elongate conductive element includes a conductive wire wrapped around said substantially flexible core material.

4. The coil of claim 1 wherein said sensing module includes an amplification circuit for said input signal.

5. The coil of claim 4 wherein said sensing module includes an integration circuit for said input signal.

6. The coil of claim 1 wherein said sensing module said modifying said input signal using at least two different modifications for two different said frequency ranges of said conductor signal.

7. The coil of claim 1 wherein said modifying of said input signal is a modification based upon an amplitude response to said conductor signal.

8. The coil of claim 1 wherein said modifying of said input signal is a modification based upon a phase response to said conductor signal.

9. The coil of claim 1 wherein said modifying of said input signal is a modification based upon a temperature response to said conductor signal.

10. The coil of claim 1 wherein said modifying of said input signal is a modification based upon at least one of an amplitude response to said conductor signal, a phase response to said conductor signal, and a temperature response to said conductor signal, wherein different frequencies of said modified input signal are used to together with a voltage signal calculate power of said conductor signal.

11. The coil of claim 10 wherein said modified input signal is based upon said amplitude response.

12. The coil of claim 10 wherein said modified input signal is based upon said phase response.

13. The coil of claim 10 wherein said modified input signal is based upon said temperature response.

14. The coil of claim 10 wherein said power is used to determine a harmonic distortion value of said power of said conductor.

15. The coil of claim 1 wherein second frequency range includes said first harmonic of generally 120 hertz.

16. The coil of claim 1 wherein said second frequency range includes said first harmonic of generally 180 hertz.

17. The coil of claim 1 wherein said second frequency range includes said first harmonic of generally 420 hertz.

18. The coil of claim 1 wherein said second frequency range includes said first harmonic of generally 780 hertz.

19. The coil of claim 1 wherein said second frequency range includes said first harmonic of generally 1860 hertz.

20. The coil of claim 1 wherein said modifying said input signal includes a non-linear amplification.

* * * * *